(12) United States Patent
Richardson

(10) Patent No.: US 6,781,481 B2
(45) Date of Patent: Aug. 24, 2004

(54) METHODS AND APPARATUS FOR FILTERING ELECTROMAGNETIC INTERFERENCE FROM A SIGNAL IN AN INPUT/OUTPUT PORT

(75) Inventor: Patrick J. Richardson, Orwell, VT (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/288,795

(22) Filed: Nov. 5, 2002

(65) Prior Publication Data

US 2004/0085157 A1 May 6, 2004

(51) Int. Cl.[7] ................................................ H03H 7/01
(52) U.S. Cl. ........................................ 333/181; 333/12
(58) Field of Search .......................... 333/181, 12, 182, 333/184, 185, 175, 177

(56) References Cited

U.S. PATENT DOCUMENTS 5,313,176 A * 5/1994 Upadhyay .................... 333/181
5,319,343 A * 6/1994 Jeffries ........................ 336/181
5,321,373 A * 6/1994 Shusterman et al. .......... 333/12
5,559,396 A * 9/1996 Bruning et al. ............. 315/291

FOREIGN PATENT DOCUMENTS

JP 11-122909 * 4/1999 ............ H02M/1/12

* cited by examiner

Primary Examiner—Robert Pascal
Assistant Examiner—Dean Takaoka
(74) Attorney, Agent, or Firm—S. Kevin Piakene; Kevin D. Wills

(57) ABSTRACT

Methods and apparatus are provided for filtering electromagnetic interference (EMI) in an input/output port such as a uniform serial bus (USB) port. An electromagnetic interference filter for an input/output port transmitting both differential signals and single-ended signals between first and second input terminals and first and second output terminals suitably includes a differential mode filter electrically that is operable to reduce electromagnetic interference while passing the differential signals and a single-ended filter that is operable to reduce electromagnetic interference while passing single-ended signals of a different bandwidth from the differential signals.

18 Claims, 1 Drawing Sheet

METHODS AND APPARATUS FOR FILTERING ELECTROMAGNETIC INTERFERENCE FROM A SIGNAL IN AN INPUT/OUTPUT PORT

FIELD OF THE INVENTION

The present invention generally relates to electrical signal filters, and more particularly relates to filtering electromagnetic interference from an input/output port such as a universal serial bus port.

BACKGROUND OF THE INVENTION

Input/output (I/O) interfaces allow various computing devices such as computers, peripherals, digital cameras, handheld devices and the like to communicate with each other. I/O interfaces typically include one or more data ports that receive cables or other connecting elements, along with associated electrical and signaling codes for data signals passing through the data port. Common interface standards used by the computing industry include Universal Serial Bus (USB), IEEE 1394 ("Firewire"), Ethernet, small computer system interface (SCSI), serial, parallel and others. One version of the USB standard, for example, is described in the Universal Serial Bus Revision 2.0 Specification dated Apr. 27, 2000 and available from the Universal Serial Bus Implementers' Forum of Fremont, Calif.

As computing speed continues to increase, I/O interface designs continue to evolve to support new technologies and ever-increasing data throughput rates. Faster data transfer rates, however, frequently result in additional design concerns. In particular, the faster signaling rates used in high-speed data ports often produce undesirable electromagnetic interference (EMI) and other noise in transmitted signals. Various schemes have been devised to reduce or remove noise, typically using one or more inductive filters to remove EMI. As data transfer speeds continue to increase, however, a need arises for increasingly sophisticated filters to remove higher frequency noise from transmitted signals.

Filter designs are often further complicated by the need for backward compatibility with older equipment. The USB version 2.0 standard, for example, requires support for devices based upon the older USB version 1.1. This backward compatibility requires that USB version 2.0 devices (which primarily transmit data using differential signals) also utilize the single-ended signals used by USB version 1.1 implementations, particularly the "end-of-packet" (EOP) waveform that is used to indicate the end of a data transmission. If the receiver does not properly receive the EOP signal, transmitted data can run together and/or become corrupted. In practice, however, the high-attenuation filters typically used for high-frequency data transmissions have been observed to distort the EOP signal such that it is not properly recognizable by the receiving device. Accordingly, the amount of attenuation that can be used in a high-speed data filter is limited by the amount of distortion produced in low-frequency or single-ended signals transmitted through the filter. This presents a significant design challenge, since the reduced attenuation generally results in increased noise and/or EMI present in the transmitted signal.

Accordingly, it is desirable to create a filter for an input/output (I/O) port that provides improved noise attenuation while effectively transmitting both differential and single-ended signals. In addition, it is desirable to create a filter that is easily implemented and that does not unduly increase the size of the I/O port. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE DRAWINGS

The following detailed description of the invention is merely exemplary in nature and is not intended to limit the invention or the application and uses of the invention. Furthermore, there is no intention to be bound by any theory presented in the preceding background of the invention or the following detailed description of the drawings.

According to various embodiments of the invention, a filter for an input/output port achieves improved electromagnetic filtering response by providing separate current paths for differential and single-ended signals. In one embodiment, a common mode choke is provided as a filter for relatively high-frequency differential signals. Additionally, one or more ferrites, inductors or other filter elements are provided in parallel to the choke to filter lower-frequency single-ended signals. By providing separate current paths for the two types of signals, the filter effectively passes both high and low-frequency signals to the filter output. Moreover, because the high-frequency filter is no longer required to pass single-ended signals, a choke with a higher attenuation than was previously possible may be used, thereby improving the overall effectiveness of the filter.

Figure 1:
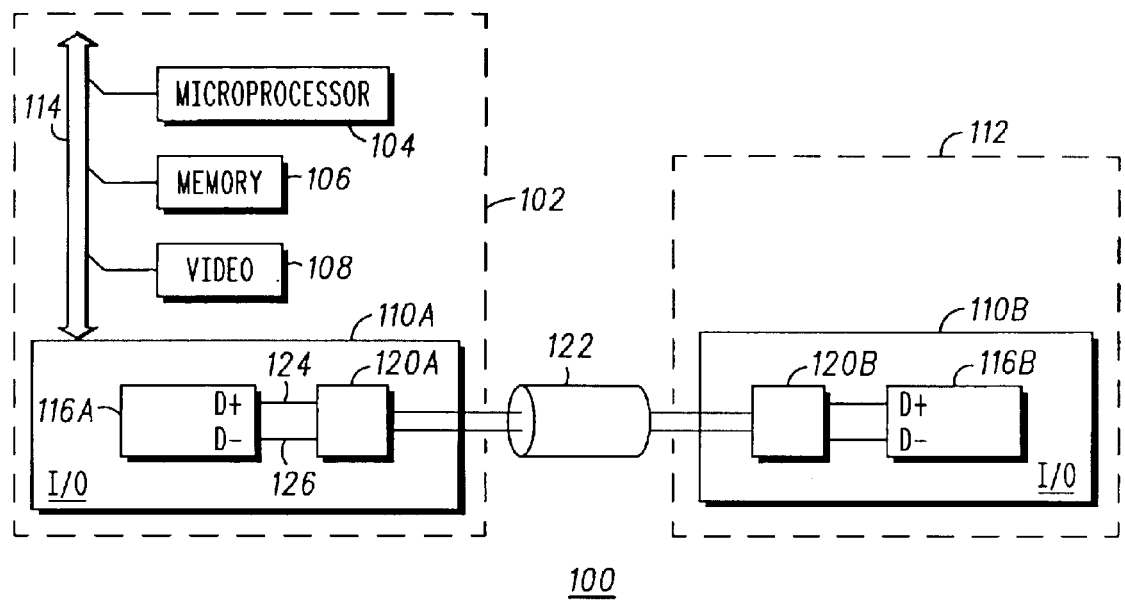
FIG. 1 is a block diagram of an exemplary computing system.

With reference now to FIG. 1, an exemplary computing system 100 suitably includes a digital computer 102 that communicates with an external device 112 across communications medium 122. In one embodiment, computer 102 is a personal computer and external device 112 is a peripheral device such as a digital camera, printer, scanner, input device, audio/visual device or the like. Computer 102 and external device 112 suitably exchange data via medium 122 using any protocol or convention, such as USB 1.1, USB 2.0, IEEE 1394, Ethernet, serial, parallel, or any other communications technique presently known or hereafter developed. Accordingly, various embodiments of communications medium 122 may encompass any type of cable, direct connection, wireless connection, cradle connection or the like.

Computer 102 is any processing device such as a personal computer, workstation, personal digital assistant, wireless phone, portable computer, video game system or the like. Computer 102 includes appropriate data processing components for the particular implementation, including a microprocessor 104, digital memory 106, optional video card 108 and/or other components that communicate via a data bus 114 or other interconnect as appropriate. Computer 102 also includes an input/output (I/O) port 110A that provides an interface to communications medium 122 and to external device 112. Device 112 also includes an appropriate input/output port 110B to support communications over medium 122.

Each I/O port 110A-B suitably includes a port controller 116 and a filter 120. As shown in FIG. 1, elements 116A and 120A are associated with I/O port 110A, and elements 116B and 120B are associated with I/O port 110B. Although implementations of I/O ports 110A and 110B are described herein as being identical, the invention is not so limited. Indeed, in practice different devices 102/112 may include implementations of 110 ports 110 with widely varying components and architectures.

Port controller 116 is any circuit or component capable of transmitting and receiving data via communications medium 122. Port controller 116 also communicates with processor 104 or any other components in computer 102 via bus 114. Accordingly, port controller 116 may be implemented with any processor, digital signal processor or controller capable of converting data from bus 114 into a format that can be transported by medium 122. Port controller 116 may be implemented as an application specific integrated circuit (ASIC), for example, that communicates with a transceiver (not shown) suited for the particular protocols transported on medium 122. In one embodiment, port controller 116 includes a USB controller available from, for example, Motorola Inc.

In operation, port controller 116 converts data between protocols used on bus 114 (e.g. the peripheral component interconnect (PCI) protocol) and those used on media 122. Many data protocols transmit data using "differential signals", which generally encode data based upon voltage differences between two transmitted electrical signals. Differential signals are generally less susceptible to noise than "single-ended signals" that encode data based upon voltage differences between a transmitted electrical signal and a reference voltage. Accordingly, port controller 116 typically supports two data signals "D+" and "D−" that are transmitted and received on two data lines 124 and 126, respectively, across medium 122. To decode transmitted data, then, controller 116 suitably computes a voltage difference between signal "D+" received on signal line 124 and signal "D−" received on signal line 126. Many data protocols incorporate "combination signaling", which includes both single-ended and differential signals on signal lines 124 and 126. As an example, a controller 116 for a USB port 110 typically converts bus data to a differential signal represented by differences in voltages passed on signals D+ and D−. End of packet (EOP) indicators in the USB protocol are appropriately appended to the end of each data transmission as a single-ended signal provided on either or both of signal lines D+ and D−, and other single-ended signals may also be present.

Filter 120 is any circuit or device capable of reducing or removing noise, electromagnetic interference (EMI) or other unwanted components of signals transmitted or received by I/O port 110. Filter 120 is suitably designed to attenuate unwanted portions of signals D+ and D− while having only minimal effects upon the signals themselves. Because the transmitted signals may contain both differential and single-ended components, filter 120 suitably provides multiple current paths for the different types of signals, as described more fully below. In such embodiments, each of the paths contains a filtering element appropriate for removing EMI and/or noise from either a high or low frequency signal corresponding to a differential or single-ended signal, respectively. Accordingly, relatively high-attenuation filters can be provided for the differential signals, resulting in improved EMI and/or noise filtering.

Figure 2:
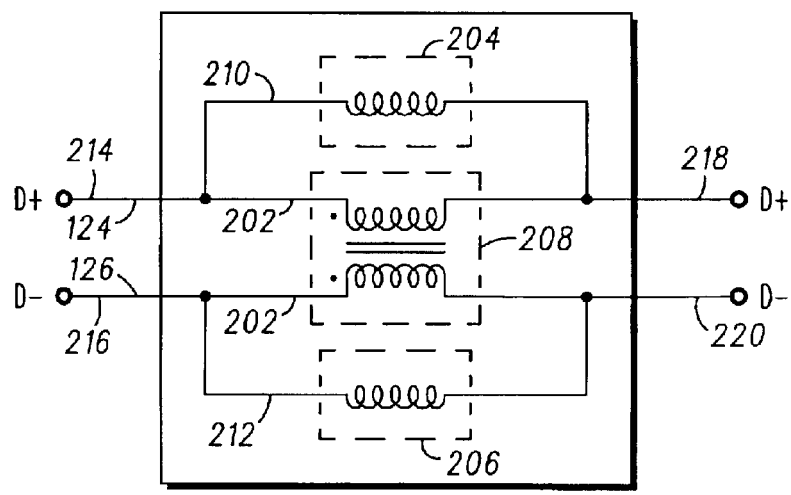
FIG. 2 is a block diagram of an exemplary filter.

With reference now to FIG. 2, an exemplary filter 120 suitably includes a differential mode signal path 202 and one or more single-ended signal paths 210, 212. Single-ended paths 210, 212 are shown wired in parallel with differential path 202 so that signals of varying frequencies and waveforms are appropriately filtered and processed. Each signal path 202, 210, 212 includes an appropriate filtering element 208, 204, 206 (respectively) such as an inductor, choke, ferrite or the like that is selected to remove EMI and/or noise from signals D+ and/or D− without degrading the quality of the signals themselves. In an exemplary embodiment, differential mode current path 202 suitably includes a relatively broad-spectrum filtering element 208, whereas single ended current paths 210; 212 contain filtering elements 204, 206 that are tuned to pass relatively low frequency signals. Accordingly, EMI and other noise from signal lines 124, 126 can be effectively reduced while both differential and single-ended signals are effectively passed through I/O port 10 (FIG. 1).

FIG. 2 shows current paths 202, 210 and 212 as variously connecting input terminals 214 and 216, respectively, to output terminals 218 and 220, respectively. "Terminal" as used herein refers to any electrical node whatsoever, and may or may not include an interface for external connection or monitoring. Accordingly, while the discussion of input terminals 214, 216 and output terminals 218, 220 is presented herein for conceptualization and ease of explanation, each of these nodes are intended as logical concepts. In a practical embodiment, input terminals 214 and 216 may represent any point or node on signal lines 124 and 126 on the input side of filter 120, and output terminals 218 and 220 may represent any point or node on signal lines 124 and 126 on the output side of filter 120. Each of these "terminals" may be physically indistinguishable from other points on signal lines 124 and 126, as appropriate. Moreover, many embodiments of filter 120 are intended as bidirectional filters. Accordingly, terminals 214 and 216 may function as input terminals while data is being transmitted and as output terminals when data is being received. Similarly, terminals 218 and 220 may function as both input and output terminals, depending on whether the particular I/O port 110 is transmitting or receiving data.

Differential signal path 202 is any current path or set of paths that is capable of transmitting differential electrical signals. Differential signal path 202 is typically implemented using multiple signal paths (e.g. wires or other carriers) such that each component of the differential signal may be simultaneously passed to the receiver. For USB 2.0 links, for example, a differential "1" logic state is denoted by the D+ signal line voltage remaining at least 200 millivolts above the D− signal voltage. Similarly, a differential "0" logic state is denoted by the D+ signal voltage remaining at least 200 millivolts below the D− signal voltage. Differential signals may be provided at a relatively high data rate; and may therefore require a relatively large amount of bandwidth. In a USB version 2.0 embodiment, for example, the differential signals may be transmitted at a data rate on the order of 480 million bits per second. Differential signal path 202 therefore includes a differential mode filter 208 that is capable of passing a relatively broad spectrum of differential signals such as a common mode choke. In one embodiment suitable for use with USB version 2.0 protocols, differential mode filter 208 is implemented with a model DLW31SN222SQ2 common mode choke available from the Murata Manufacturing Co. of Kyoto, Japan. While this particular choke is a relatively high attenuation component with impedance on the order of about 2.2 kOhms at 100 MHz, other models of chokes or other filtering components having a wide range of specifications could be used to implement other embodiments of filtering element 208.

Single-ended signal paths 210 and 212 are any current paths or sets of paths that are capable of transmitting single-ended electrical signals. Each single-ended signal path 210, 212 is typically implemented using a single carrier, since the transmitted signal is intended to be compared to a reference signal available at the receiver. As shown in FIG. 2, single-ended paths 210 and 212 are configured in parallel connection to differential path 202 for each signal line 124 and 126, respectively. In alternate embodiments, only one single-ended signal line 124 or 126 may be required.

According to most protocols with combination signaling, single-ended signals are commonly provided at much lower data rates than differential signals, and therefore require a relatively low amount of bandwidth. In a conventional USB implementation, for example, an end-of-packet (EOP) condition may be represented with a single-ended zero (SE0) signal that is out-of-band and asynchronous to the in-band differential signaling discussed above. The bandwidth requirements of single-ended filtering elements 204, 206, then, are correspondingly lower than those for differential filtering element 208. In one embodiment suitable for use with USB version 2.0 protocols, filtering elements 204, 206 are implemented with ferrites or other filters commonly used with USB version 1.1 implementations, such as the model BLM15BD601 ferrite available from Murata Manufacturing Co. Of course other models of ferrites, inductors or other filters having a wide range of specifications could be used to implement other embodiments of filtering elements 204 and 206.

In operation, then, filter 120 processes differential and single-ended signals received at input terminals 214 and 216 along separate paths to output terminals 218, 220. In-band differential signals are appropriately provided to a common-mode choke or other differential filter 208, which suitably reduces or removes EMI and/or noise produced by signal lines 124, 126 and/or other sources. Single-ended signals are simultaneously provided to one or more ferrites or other single-ended filters provided in parallel to the differential filter. Accordingly, both differential and single-ended signals are effectively passed through filter 120 without significant degradation or distortion.

By providing separate signal paths for the different types of signals, greater noise and EMI suppression can be applied to the differential signal. Generally speaking, the terms "high-attenuation" and "broad spectrum" filter as used herein refer to filters with impedance in excess of about 150–200 ohms, and possibly as high as about 3 kOhms or even higher. "Low attenuation" filters, as described herein, typically exhibit impedances of about 90 ohms as commonly used in many prior art implementations of USB version 2.0. As briefly mentioned above, broad spectrum filtering was not previously available for filtering combination signals because the high attenuation tended to distort the single-ended waveforms passing through the filter. By providing separate paths 210 and 212 for single-ended signals, then, the attenuation of the in-band path 202 can be greatly increased, thus resulting in greatly improved EMI and/or noise reduction in filter 120 and improved performance in I/O port 110.

While an exemplary embodiment(s) has been presented in the foregoing detailed description of the invention, it should be appreciated that a vast number of variations and equivalents exist. For example, while certain aspects of the invention have been described herein with reference to the universal serial bus standard, the concepts disclosed herein may be readily adapted to other port or interface specifications such as SCSI, wireless, or any other protocol that incorporates combination signaling. It should be appreciated that these exemplary embodiments are only examples, and are not intended to limit the scope, applicability, or configuration of the invention in any way. Rather, the foregoing detailed description will provide a convenient road map for implementing exemplary embodiments of the invention. Various changes may be made in the function and arrangement of elements described in any of the exemplary embodiments without departing from the scope of the invention as set forth in the appended claims and their legal equivalents.

What is claimed is:

1. An apparatus, comprising:
   an input/output port coupled for passing both differential signals and single-ended signals between a first and second input terminal and a first and second output terminal;
   an electromagnetic interference filter integral with the input/output port; the electromagnetic interference filter comprising:
   a differential mode filter electrically coupled to the input terminals and to the output terminals, wherein the differential mode filter is operable to reduce electromagnetic interference while passing the differential signals; and
   a single-ended filter electrically coupled to the input terminals and to the output terminals in parallel with the differential mode filter, wherein the single-ended filter is operable to reduce electromagnetic interference while passing single-ended signals.

2. The apparatus of claim 1 wherein the single-ended filter comprises a first signal path coupled to the first input terminal and to the first output terminal and a second signal path coupled to the second input terminal to the second output terminal.

3. The apparatus of claim 1 wherein the differential mode filter comprises a common mode choke.

4. The apparatus of claim 2 wherein each of the first and second signal paths comprise a filtering element.

5. The filter of claim 2 wherein each of the first and second signal paths comprise a filtering element.

6. The apparatus of claim 4 wherein the filtering element is a ferrite.

7. The filter of claim 4 wherein the filtering element is a ferrite.

8. The apparatus of claim 6 wherein the common mode choke is a high attenuation choke.

9. An apparatus, comprising:
   an input/output port coupled for passing both differential signals and single-ended signals between a first and second input terminal and a first and second output terminal;
   an electromagnetic interference filter integral with the input/output port; the electromagnetic interference filter comprising:
   a high-frequency differential signal path electrically coupling the input terminals and the output terminals, the differential signal path comprising a broad spectrum filter;
   a first low-frequency signal path coupling the first input terminal to the first output terminal in parallel connection to the differential mode signal path and comprising a first filtering element; and
   a second low-frequency signal path coupling the second input terminal to the second output terminal in parallel connection to the differential mode signal path and comprising a second filtering element.

10. The filter of claim 9 wherein the first and second filtering elements each comprise a ferrite.

11. The apparatus of claim 9 wherein the broad spectrum filter comprises a common mode choke.

12. The filter of claim 11 wherein the choke is a high attenuation choke.

13. A computing system, comprising:

an input/output port coupled for passing both differential signals and single-ended signals between a first and second input terminal and a first and second output terminal;

an electromagnetic interference filter integral with the input output port; the electromagnetic interference filter comprising:

a differential signal path electrically coupling the input terminals and the output terminals, the high-frequency signal path comprising a common mode choke;

a first single-ended signal path coupling the first input terminal to the first output terminal in parallel connection to the differential signal path and comprising a first filtering element; and a second single-ended signal path coupling the second input terminal to the second output terminal in parallel connection to the differential signal path and comprising a second filtering element.

14. An apparatus, comprising:

an input/output port coupled for passing both differential signals and single-ended signals between a first and second input terminal and a first and second output terminal;

an electromagnetic interference filter integral with the input/output port; the electromagnetic interference filter comprising:

means for filtering the differential signal electrically coupled to the input terminals and to the output terminals and configured to reduce electromagnetic interference in the differential signals; and means for filtering the single-ended signals coupled in parallel with the means for filtering the differential signal, and being configured to reduce electromagnetic interference in the signal-ended signals.

15. A method, comprising:

providing an input/output port coupled for passing both differential signals and single-ended signals between a first and second input terminal and a first and second output terminal;

providing an electromagnetic interference filter integral with the input/output port;

receiving an input signal at the first and a second input terminals;

providing the input signal to a differential signal filter to reduce electromagnetic interference from the differential portion; and providing the input signal to a single-ended filter coupled in parallel with the differential filter to reduce electromagnetic interference in the single-ended portion of the input signal.

16. The method of claim 15 wherein the differential filter comprises a common-mode choke.

17. The method of claim 16 wherein the choke is a broad spectrum choke.

18. The method of claim 16 wherein the low-frequency filter comprises a first signal path and a second signal path, each of the signal paths coupled in parallel to the differential filter.

* * * * *